(12) United States Patent
Kim et al.

(10) Patent No.: US 10,396,740 B2
(45) Date of Patent: Aug. 27, 2019

(54) MICROPHONE DRIVING DEVICE AND DIGITAL MICROPHONE INCLUDING THE SAME

(71) Applicant: ELECTRONICS AND TELECOMMUNICATIONS RESEARCH INSTITUTE, Daejeon (KR)

(72) Inventors: Yi-Gyeong Kim, Daejeon (KR); Woo Seok Yang, Daejeon (KR); Min-Hyung Cho, Daejeon (KR)

(73) Assignee: ELECTRONICS & TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/684,625

(22) Filed: Aug. 23, 2017

(65) Prior Publication Data

US 2018/0138882 A1    May 17, 2018

(30) Foreign Application Priority Data

Nov. 14, 2016 (KR) .................. 10-2016-0151336
Mar. 29, 2017 (KR) .................. 10-2017-0040285

(51) Int. Cl.
*H04R 1/08* (2006.01)
*H03G 3/30* (2006.01)
*H04R 3/00* (2006.01)

(52) U.S. Cl.
CPC ......... *H03G 3/3089* (2013.01); *H03G 3/3005* (2013.01); *H03G 3/3026* (2013.01); *H04R 1/08* (2013.01); *H04R 3/00* (2013.01); *H04R 2410/03* (2013.01)

(58) Field of Classification Search
CPC .. H03G 3/3089; H03G 3/3005; H03G 3/3026; H03F 3/181; H03F 2200/03; H04R 1/00; H04R 1/08; H04R 2410/03
USPC ........... 381/107, 120, 28; 341/155; 330/278, 330/102
See application file for complete search history.

(56) References Cited

U.S. PATENT DOCUMENTS 8,223,981 B2   7/2012 Haila et al.
8,983,090 B2   3/2015 Kim et al.
9,407,224 B2   8/2016 Pinna et al.
(Continued)

*Primary Examiner* — Vivian C Chin
*Assistant Examiner* — Con P Tran

(57) ABSTRACT

The present disclosure relates to a microphone driving device and a digital microphone including the same. A microphone driving device according to an embodiment of the inventive concept includes a voltage-to-current converter, a current-to-voltage converter, an analog-to-digital converter, a digital amplification unit, and a gain controller. The voltage-to-current converter converts an acoustic signal to an output current signal based on a gain control signal. The current-to-voltage converter converts the output current signal to an amplified voltage signal. The analog-to-digital converter converts the amplified voltage signal to a digital signal. The digital amplification unit amplifies the digital signal to an amplified digital signal based on the gain control signal. The gain controller generates a gain control signal. The microphone driving device and the digital microphone including the same according to the inventive concept may have a wide dynamic range and reduce the influence of noise.

19 Claims, 10 Drawing Sheets

(56) References Cited

U.S. PATENT DOCUMENTS

| | | |
|---|---|---|
| 9,413,317 B2 | 8/2016 | Kropfitsch et al. |
| 2006/0034472 A1* | 2/2006 | Bazarjani ............ H04R 19/005 |
| | | 381/111 |
| 2008/0069373 A1* | 3/2008 | Jiang .................... H04R 3/04 |
| | | 381/94.1 |
| 2013/0148826 A1* | 6/2013 | Chung ................... H03G 3/20 |
| | | 381/107 |
| 2014/0037031 A1* | 2/2014 | Acosta-Serafini ...... H03G 3/30 |
| | | 375/345 |
| 2015/0184348 A1 | 7/2015 | Stracke, Jr. |
| 2016/0150325 A1 | 5/2016 | Oliaei |

* cited by examiner

US 10,396,740 B2

MICROPHONE DRIVING DEVICE AND DIGITAL MICROPHONE INCLUDING THE SAME

CROSS-REFERENCE TO RELATED APPLICATIONS

This U.S. non-provisional patent application claims priority under 35 U.S.C. § 119 of Korean Patent Application Nos. 10-2016-0151336, filed on Nov. 14, 2016, and 10-2017-0040285, filed on Mar. 29, 2017, the entire contents of which are hereby incorporated by reference.

BACKGROUND

The present disclosure relates to processing of acoustic signals, and more particularly, to a microphone driving device and a digital microphone including the same.

Digital Micro Electro Mechanical Systems (MEMS) microphones include MEMS transducers and application specific integrated circuits (ASICs). The MEMS transducer includes a capacitor whose capacitance varies with a sound pressure change. The MEMS transducer transfers electrical signals generated by these capacitors to the ASIC. A typical ASIC amplifies the electrical signal received from the MEMS transducer at a specified rate. In this case, the amplification gain of the ASIC's amplifier depends on the maximum value of the input signal of an analog-to-digital converter.

Recent digital MEMS microphones are required to have a wide dynamic range by enabling high sound pressure signal processing of over 130 dBSPL. A digital MEMS microphone using an existing fixed amplification gain should apply a signal to an analog-to-digital converter within the maximum input signal range of the analog-to-digital converter. In this case, when a signal of a relatively low sound pressure is applied to the ASIC, the SNR characteristic deteriorates. Therefore, there is a demand for a microphone driving device for improving SNR characteristics while expanding the dynamic range of a digital microphone.

SUMMARY

The present disclosure may provide a microphone driving device for securing a wide dynamic range and improving SNR characteristics and a digital microphone including the same.

A microphone driving device according to an embodiment of the inventive concept includes an analog amplification unit, an analog-to-digital converter, a digital amplification unit, and a gain controller. The analog amplification unit includes a voltage-to-current converter and a current-to-voltage converter. The voltage-to-current converter may include a normal voltage-to-current converter and an adjustment voltage-to-current converter. The adjustment voltage-to-current converter may be provided in plurality.

The analog amplification unit amplifies an acoustic signal based on a gain control signal. The voltage-to-current converter converts the acoustic signal to an output current signal. The normal voltage-to-current converter converts the acoustic signal to a normal output current signal. The adjustment voltage-to-current converter is connected in parallel to the normal voltage-to-current converter and converts the acoustic signal to an adjustment output current signal. The adjustment voltage-to-current converter generates an adjustment output current signal based on the gain control signal. The adjustment voltage-to-current converter may provide the adjustment output current signal to the current-to-voltage converter when the gain control signal is in a high level. The adjustment voltage-to-current converter may block the generation of the adjustment output current signal when the gain control signal is in a low level. For example, the current-to-voltage converter may receive a gain control signal instead of the voltage-to-current converter.

The analog-to-digital converter converts the amplified voltage signal to digital signal. The digital amplification unit amplifies the digital signal to amplified digital signal based on the gain control signal. The amplification gain of the amplified digital signal for the acoustic signal may be maintained constant.

For example, a gain controller may generate a gain control signal based on an amplified voltage signal. If the amplified voltage signal is greater than a first reference value, the gain controller may generate a first gain control signal. If the amplified voltage signal is less than a second reference value, the gain controller may generate a second gain control signal. The first gain control signal may block the generation of the adjustment output current signal. The second gain control signal may control the adjustment voltage-to-current converter to generate an adjustment output current signal. For example, a gain controller may generate a gain control signal based on an acoustic signal instead of an amplified voltage signal.

A digital microphone according to an embodiment of the inventive concept may include a transducer, a normal voltage-to-current converter, a plurality of adjustment voltage-to-current converters, a current-to-voltage converter, an analog-to-digital converter, a digital amplification unit, and a gain controller. The transducer senses an input sound pressure and generates an acoustic signal based on the input sound pressure. The gain controller generates a gain control signal based on the input sound pressure. The gain controller provides a gain control signal to the plurality of adjustment voltage-to-current converters and the digital amplification unit.

The gain controller may receive an amplified voltage signal. In this case, the gain controller determines whether to generate an adjustment output current signal according to a voltage level of the amplified voltage signal. The gain controller may receive an acoustic signal. In this case, the gain controller may determine whether to generate an adjustment output current signal according to a voltage level of the acoustic signal.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

In the following, embodiments of the inventive concept will be described in detail so that those skilled in the art easily carry out the inventive concept.

Figure 1:
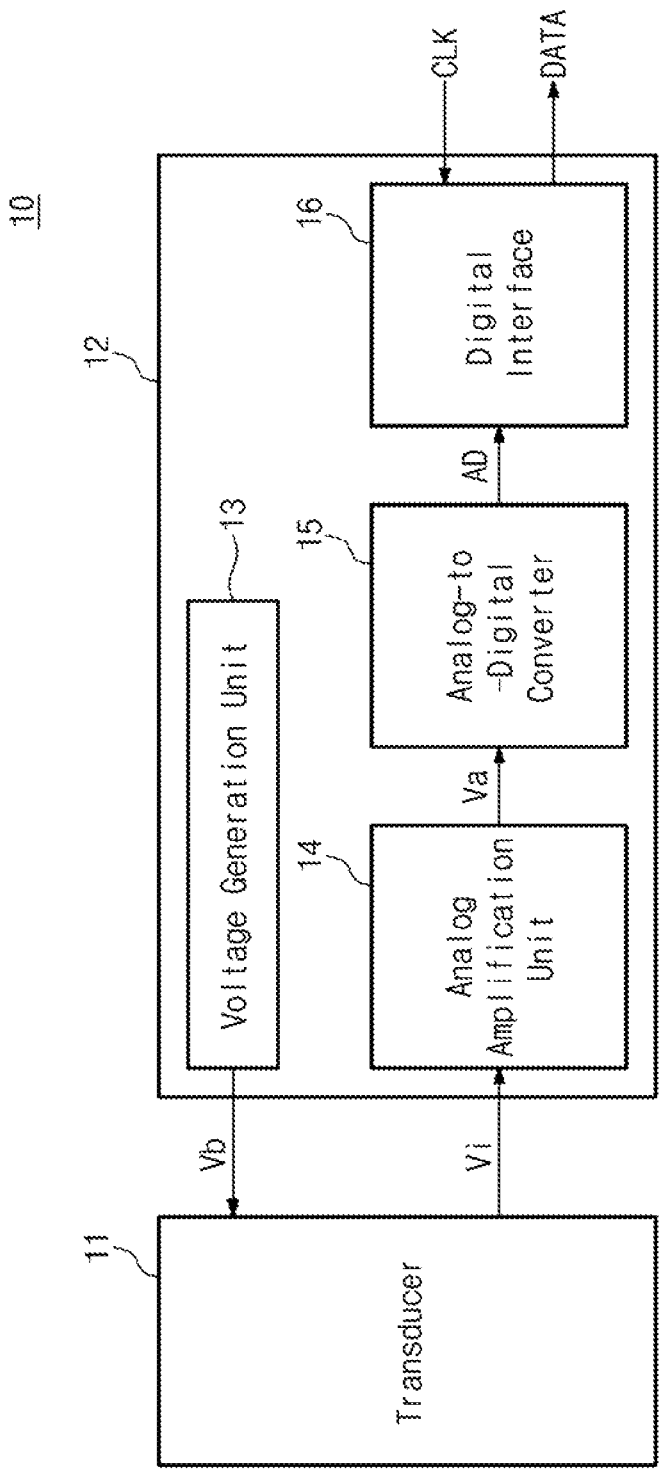
FIG. 1 is a block diagram of a digital microphone.

FIG. 1 is a block diagram of a digital microphone. Referring to FIG. 1, a digital microphone 10 includes a transducer 11 and a microphone driving device 12. The transducer 11 may be a MEMS transducer. The microphone driving device 12 may be an Application Specific Integrated Circuits (ASICs). The microphone driving device 12 includes a voltage generation unit 13, an analog amplification unit 14, an analog-to-digital converter 15, and a digital interface 16.

The transducer 11 receives a bias voltage Vb from the microphone driving device 12. The transducer 11 may include two electrode layers having the same characteristics as a variable capacitor. The transducer 11 may receive an external sound wave or the like and generate an electric signal based on the vibration of the received sound wave. The interval between the two electrode layers varies with a sound pressure by sound wave. A capacitance value changes according to the interval between the two electrode layers. When the bias voltage Vb is applied to the transducer 11 and the sound pressure changes, the transducer 11 generates an acoustic signal Vi in the microphone driving device 12 based on the varying capacitance value. The acoustic signal Vi is generated based on the amount of charge stored between the two electrode layers and a voltage value between the both ends of the transducer 11 generated based on a capacitance due to the two electrode layers.

The microphone driving device 12 receives the acoustic signal Vi from the transducer 11. The microphone driving device 12 processes the acoustic signal Vi to generate output data DATA. The microphone driving device 12 provides the bias voltage Vb for driving the transducer 11 to the transducer 11. The voltage generation unit 13 generates the bias voltage Vb. The voltage generation unit 13 provides a voltage value required for driving the digital microphone 10 or the transducer 11 to the transducer 11.

The analog amplification unit 14 receives the acoustic signal Vi from the transducer 11. The analog amplification unit 14 amplifies the acoustic signal Vi to generate an amplified voltage signal Va. The analog amplification unit 14 has a fixed amplification gain. The amplification gain may be defined as a ratio of the maximum value of the acoustic signal Vi corresponding to the Acoustic Overload Point (AOP) to the maximum input value of the analog-to-digital converter 15. For example, if the acoustic signal Vi with an AOP of 120 dBSPL is 566 mVpp and the input maximum value of the analog-to-digital converter 15 is 2.4 Vpp, the amplification gain may be fixed at 12.5 dB (4.24 times). The analog amplification unit 14 may include a source follower for stably receiving the acoustic signal Vi and a gain amplifier for generating the amplified voltage signal Va.

The analog-to-digital converter 15 receives the amplified voltage signal Va from the analog amplification unit 14. The analog-to-digital converter 15 converts the amplified voltage signal Va, which is an analog signal, to digital signal AD, which is a digital signal. The analog-to-digital converter 15 may generate the digital signal AD in synchronization with a clock signal CLK received from the digital interface 16. The analog-to-digital converter 15 may convert the amplified voltage signal Va to the digital signal AD in various ways. For example, the analog-to-digital converter 15 may convert an analog signal to a digital signal using a delta-sigma modulation scheme.

The digital interface 16 receives the digital signal AD from the analog-to-digital converter 15. The digital interface 16 interfaces with other electronic devices or modules. For example, the digital interface 16 may interface with a digital signal post-processing device, a speaker module, or the like. The digital interface 16 may receive the clock signal CLK from the outside and provide it to the analog-to-digital converter 15. The digital interface 16 may provide output data DATA including the digital signal AD to the outside. The output data DATA may be a data stream using a Pulse Density Modulation (PDM) scheme. Alternatively, the output data DATA may be Integrated Interchip Sound (I2S) serial data.

When the digital microphone 10 requires a high sound pressure signal processing of 130 dBSPL or more in order to have a wide dynamic range, the amplified voltage signal Va corresponding to the AOP should be formed in a voltage level within the input signal range of the analog-to-digital converter 15. That is, since the amplification gain of the analog amplification unit 14 depends on the characteristics of the analog-to-digital converter 15, the amplification gain has a limit. Thus, when the acoustic signal Vi of a low voltage level is applied to the microphone driving device 12 having a wide dynamic range, the amplified voltage signal Va has a relatively low voltage level. In this case, the Signal to Noise Ratio (SNR) characteristic of the microphone driving device 12 deteriorates.

Figure 2:
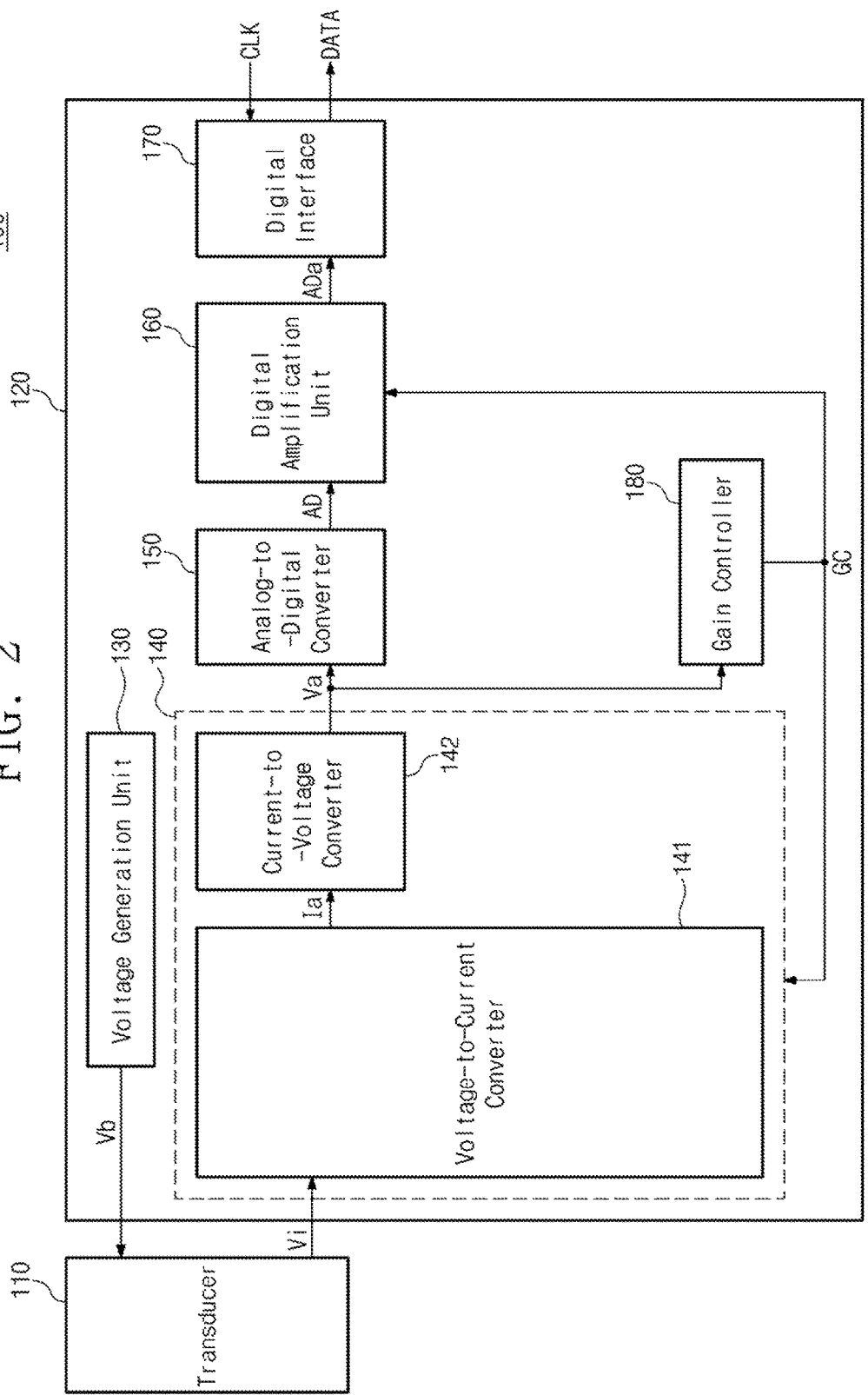
FIGS. 2 and 3 are block diagrams of a digital microphone according to an embodiment of the inventive concept.

FIG. 2 is a block diagram of a digital microphone according to an embodiment of the inventive concept. Referring to FIG. 2, a digital microphone 100 includes a transducer 110 and a microphone driving device 120. The microphone driving device 120 includes a voltage generation unit 130, an analog amplification unit 140, an analog-to-digital converter 150, a digital amplification unit 160, a digital interface 170, and a gain controller 180. Since the transducer 110, the voltage generation unit 130, and the digital interface 170 of FIG. 2 perform the same functions as the transducer 11, the voltage generation unit 13, and the digital interface 16 of FIG. 1, their detailed descriptions will be omitted.

The analog amplification unit 140 includes a voltage-to-current converter 141 and a current-to-voltage converter 142. The voltage-to-current converter 141 receives an acoustic signal Vi from the transducer 110. The voltage-to-current converter 141 converts the acoustic signal Vi to an output current signal Ia. The current-to-voltage converter 142 receives the output current signal Ia. The current-to-voltage converter 142 converts the output current signal Ia to an amplified voltage signal Va. The analog amplification unit 140 receives a gain control signal GC from the gain controller 180. The analog amplification unit 140 amplifies the acoustic signal Vi to an amplified voltage signal Va based on the gain control signal GC. The specific analog amplification process of the analog amplification device 140 is described below.

The analog-to-digital converter 150 receives the amplified voltage signal Va from the analog amplification unit 140. The analog-to-digital converter 150 converts the amplified voltage signal Va to digital signal AD. The analog-to-digital converter 150 may convert the amplified voltage signal Va to the digital signal AD by using a PDM scheme. For example, the analog-to-digital converter 150 may convert the amplified voltage signal Va to digital signal AD having a sampling rate of 1 bit.

The digital amplification unit 160 receives the digital signal AD from the analog-to-digital converter 150. The digital amplification unit 160 amplifies the digital signal AD to generate amplified digital signal ADa. The digital amplification unit 160 receives a gain control signal GC from the gain controller 180. The digital amplification unit 160 amplifies the digital signal AD to amplified digital signal ADa based on the gain control signal GC. The digital amplification unit 160 delivers the amplified digital signal ADa to the digital interface 170.

The gain controller 180 generates a gain control signal GC. The gain controller 180 receives the amplified voltage signal Va generated by the analog amplification unit 140. The gain controller 180 generates a gain control signal GC based on the amplified voltage signal Va. However, the inventive concept is not limited thereto, and the gain controller 180 may receive the acoustic signal Vi and generate the gain control signal GC based on the acoustic signal Vi. The gain controller 180 provides the gain control signal GC to the analog amplification unit 140 and the digital amplification unit 160. The gain control signal GC is applied to the voltage-to-current converter 141 or the current-to-voltage converter 142.

The gain control signal GC controls the amplification gain of the analog amplification unit 140 and the amplification gain of the digital amplification unit 160. When a voltage level of the acoustic signal Vi is low, that is, when the digital microphone 100 senses a low sound pressure, the gain control signal GC controls the amplification gain of the analog amplification unit 140 to be high. Also, the gain control signal GC controls the amplification gain of the digital amplification unit 160 to be low. When a voltage level of the acoustic signal Vi is high, that is, when the digital microphone 100 senses a high sound pressure, the gain control signal GC controls the amplification gain of the analog amplification unit 140 to be low. Also, the gain control signal GC controls the amplification gain of the digital amplification unit 160 to be high. Details will be described later.

Figure 3:
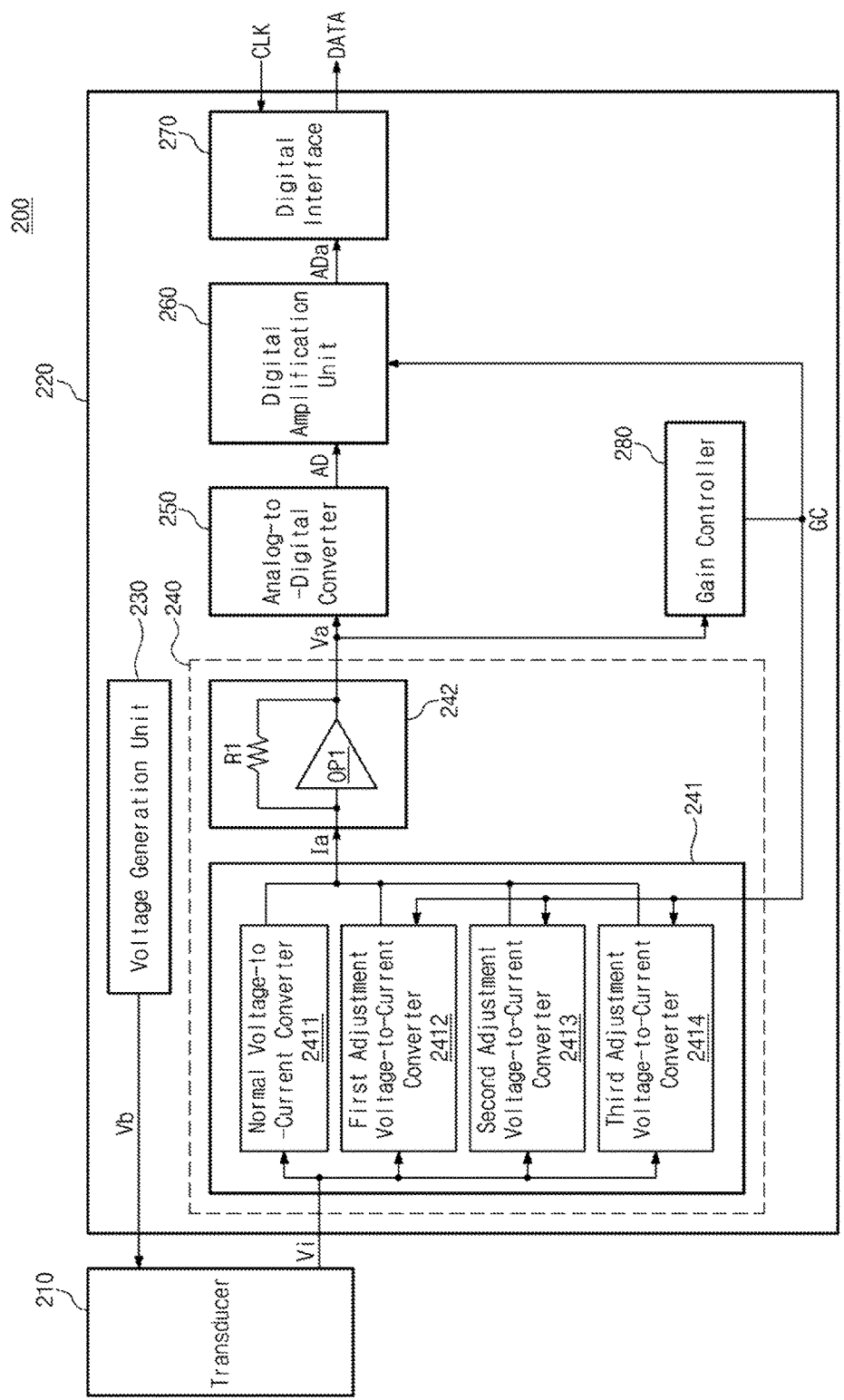

FIG. 3 is a block diagram of a digital microphone according to an embodiment of the inventive concept. Referring to FIG. 3, a digital microphone 200 includes a transducer 210 and a microphone driving device 220. The microphone driving device 220 includes a voltage generation unit 230, an analog amplification unit 240, an analog-to-digital converter 250, a digital amplification unit 260, a digital interface 270, and a gain controller 280. The analog amplification unit 240 includes a voltage-to-current converter 241 and a voltage-to-current converter 242.

The voltage-to-current converter 241 includes a normal voltage-to-current converter 2411, a first adjustment voltage-to-current converter 2412, a second adjustment voltage-to-current converter 2413, and a third adjustment voltage-to-current converter 2414. The first adjustment voltage-to-current converter 2412, the second adjustment voltage-to-current converter 2413, and the third adjustment voltage-to-current converter 2414 are connected in parallel to each other. Although it is shown in FIG. 3 that the voltage-to-current converter 241 includes three adjustment voltage-to-current converters, the inventive concept is not limited thereto, and the voltage-to-current converter 241 may include a variable number of adjustment voltage-to-current converters.

The normal voltage-to-current converter 2411, the first adjustment voltage-to-current converter 2412, the second adjustment voltage-to-current converter 2413, and the third adjustment voltage-to-current converter 2414 all receive the same acoustic signal Vi. The normal voltage-to-current converter 2411 converts the acoustic signal Vi to a normal output current signal. The first to third adjustment voltage-to-current converters 2412 to 2414 receive the gain control signal GC. The first to third adjustment voltage-to-current converters 2412 to 2414 convert the acoustic signal Vi to an adjustment output current signal based on the gain control signal GC. More specifically, the first adjustment voltage-to-current converter 2412 generates a first adjustment output current signal, the second adjustment voltage-to-current converter 2413 generates a second adjustment output current signal, and third voltage-to-current converter 2414 generates a third adjustment output current signal. The magnitudes of the first to third adjustment output current signals may be equal to each other.

The normal voltage-to-current converter 2411 generates a normal output current signal based on the acoustic signal Vi regardless of the gain control signal GC. On the other hand, the first to third adjustment voltage-to-current converters 2412 to 2414 may or may not generate an adjustment output current signal in response to the gain control signal GC. For example, the gain control signal GC generated when the digital microphone 200 senses a low sound pressure controls the first to third adjustment voltage-to-current converters 2412 to 2414 to generate an adjustment output current signal. The gain control signal GC generated when the digital microphone 200 senses a high sound pressure controls the first to third adjustment voltage-to-current converters 2412 to 2414 not to generate an adjustment output current signal.

The voltage-to-current converter 241 converts the acoustic signal Vi to an output current signal Ia. When each of the first to third adjustment voltage-to-current converters 2412 to 2414 generates an adjustment output current signal, the output current signal Ia is equal to the sum of a normal output signal and an adjustment output current signal. For example, when the magnitudes of the normal output current signal and the adjustment output current signal are the same, the output current signal Ia may have a magnitude of four times the normal output current signal. As the number of voltage-to-current converters is greater, the magnitude of the output current signal Ia becomes greater. When each of the first to third adjustment voltage-to-current converters 2412 to 2414 does not generate an adjustment output current signal, the output current signal Ia is equal to the normal output current signal.

The current-to-voltage converter 242 receives the output current signal Ia from the voltage-to-current converter 241. The current-to-voltage converter 242 converts the output current signal Ia to an amplified voltage signal Va. The current-to-voltage converter 242 may include an operational amplifier OP1 and a resistor R1. The operational amplifier OP1 and the resistor R1 may be connected in parallel with each other. The resistor R1 may receive the output current signal Ia and the output terminal of the operational amplifier OP1 may generate an amplified voltage signal Va based on the output current signal Ia. However, the inventive concept is not limited thereto, and the current-to-voltage converter 242 may include various types of circuits or elements for converting a current signal to a voltage signal.

The magnitude of the amplified voltage signal Va depends on the magnitude of the output current signal Ia. As a current value of the output current signal Ia is greater, a voltage level of the amplified voltage signal Va may increase. For example, the amplified voltage signal Va generated when the output current signal Ia is equal to the normal output current signal may have a lower voltage level than the amplified voltage signal Va generated when the output current signal Ia is equal to the sum of the normal output current signal and the adjustment output current signal. The amplification gain of the analog amplification unit 240 when the digital microphone 200 senses a low sound pressure is greater than the amplification gain of the analog amplification unit 240 when the digital microphone 200 senses a high sound pressure. That is, in the process of amplifying the acoustic signal Vi to the amplified voltage signal Va, the generation of the adjustment output current signal affects the magnitude of the amplified voltage signal Va.

The amplification gain of the analog amplification unit 240 is determined based on the gain control signal GC. The gain control signal GC controls the voltage-to-current converter 241 so that an analog amplification gain when a low sound pressure is sensed is greater than an analog amplification gain when a high sound pressure is sensed. In comparison with the high sound pressure, the quality deterioration of the low sound pressure due to noise may more easily occur. Thus, when a low sound pressure is sensed, the noise influence by the current-to-voltage converter 242 and the analog-to-digital converter 250 is reduced by the high amplification gain of the analog amplification unit 240. In addition, since the amplification of the acoustic signal Vi of the microphone driving device 200 is performed at the front ends of the current-to-voltage converter 242 and the analog-to-digital converter 250, noise amplification occurring during a signal delivery process may be minimized. When a high sound pressure is sensed, the analog amplification gain becomes low so that the amplified voltage signal Va that does not exceed the maximum input signal range of the analog-to-digital converter 250 may be provided. Further, under a fixed maximum input signal range, the digital microphone 200 may have a wide dynamic range.

The analog-to-digital converter 250 converts an amplified voltage signal Va to digital signal AD. The digital amplification unit 260 amplifies the digital signal AD to generate amplified digital signal ADa. The amplification gain of the digital amplification unit 260 is determined based on the gain control signal GC. The gain control signal GC controls the digital amplification unit 260 such that a digital amplification gain when a high sound pressure is sensed is greater than a digital amplification gain when a low sound pressure is sensed. For example, the gain control signal GC may control the digital amplification unit 260 to have a first digital amplification gain when a low sound pressure is sensed. When a high sound pressure is sensed, the gain control signal GC may control the digital amplification unit 260 to have a second digital amplification gain higher than the first digital amplification gain. As a result, the system amplification gain considering both the analog amplification by the analog amplification unit 240 and the digital amplification by the digital amplification unit 260 may be the same in high and low sound pressure environments.

The gain controller 280 receives an amplified voltage signal Va. The gain controller 280 may determine the magnitude of the gain control signal GC based on the amplified voltage signal Va. If a voltage level of the amplified voltage signal Va is high, the gain controller 280 may determine that a high sound pressure is sensed. In this case, the gain controller 280 may block the generation of the adjustment output current signals of the first to third adjustment voltage-to-current converters 2412 to 2414. At the same time, the gain controller 280 may increase the amplification gain of the digital amplification unit 260. If a voltage level of the amplified voltage signal Va is low, the gain controller 280 may determine that a low sound pressure is sensed. In this case, the gain controller 280 may control the first to third adjustment voltage-to-current converters 2412 to 2414 to generate an adjustment output current signal. At the same time, the gain controller 280 may decrease the amplification gain of the digital amplification unit 260.

Figure 4:
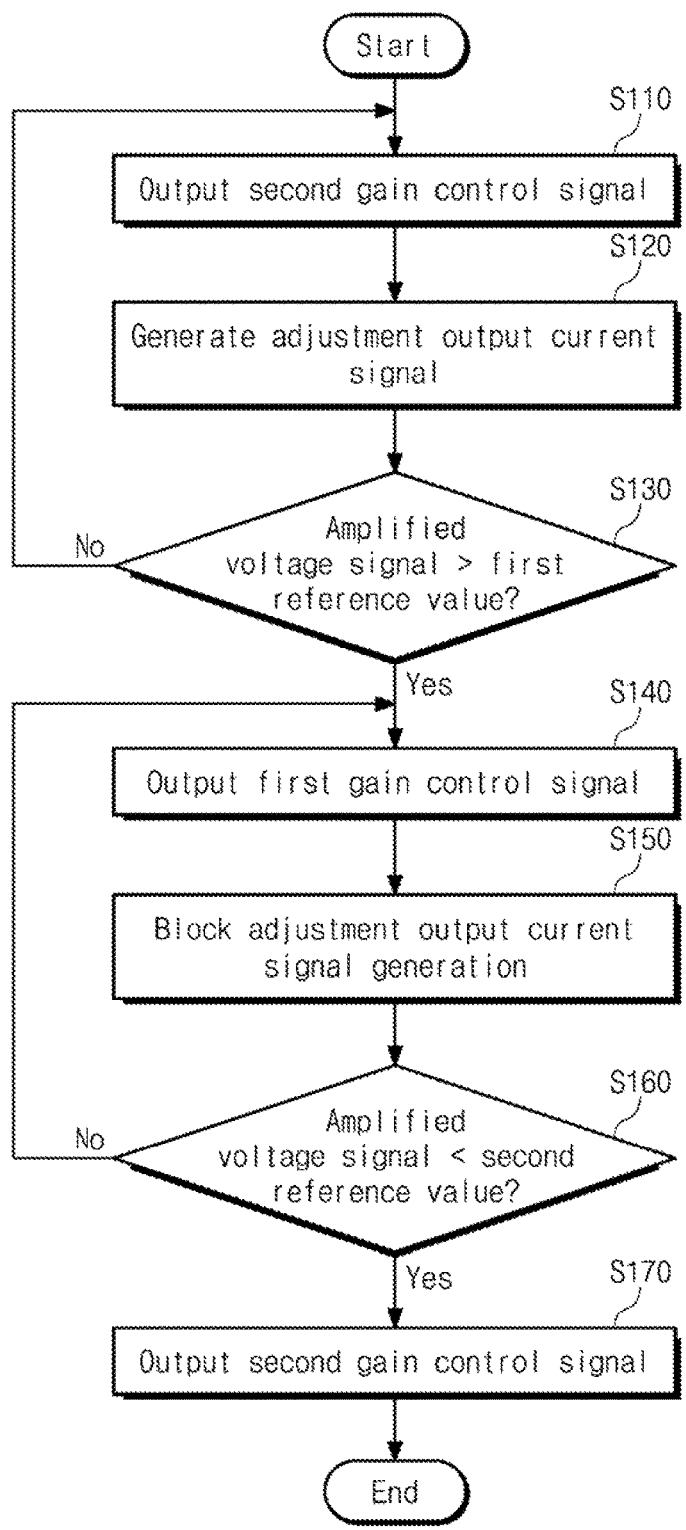
FIG. 4 is a flowchart illustrating a driving method of a microphone driving device of FIG. 3.

FIG. 4 is a flowchart illustrating a driving method of the microphone driving device of FIG. 3. The driving method of the microphone driving device of FIG. 4 is performed in the microphone driving device 220 of FIG. 3. Specifically, the driving method of the microphone driving device of FIG. 4 may be performed in the voltage-to-current converter 241 and the gain controller 280 of FIG. 3. In the start operation, it will be understood that the digital microphone 200 senses a low sound pressure. A first gain control signal and a second gain control signal disclosed in FIG. 4 are included in the gain control signal GC. The first gain control signal corresponds to a gain control signal GC generated when the digital microphone 200 senses a high sound pressure. The second gain control signal corresponds to a gain control signal GC generated when the digital microphone 200 senses a low sound pressure.

In operation S110, the microphone driving device 220 outputs a second gain control signal. In operation S110, the transducer 210 senses a low sound pressure signal, and the microphone driving device 220 receives an acoustic signal Vi of a low level. The gain controller 280 generates a second gain control signal and provides the second gain control signal to the first to third adjustment voltage-to-current converters 2412 to 2414 and the digital amplification unit 260.

In operation S120, the microphone driving device 220 generates an adjustment output current signal. The first to third adjustment voltage-to-current converters 2412 to 2414 receive a second gain control signal. The first to third adjustment voltage-to-current converters 2412 to 2414 provide the adjustment output current signal to the current-to-voltage converter based on the second gain control signal. Thus, the amplification gain of the analog amplification unit 240 increases.

In operation S130, the microphone driving device 220 compares the amplified voltage signal Va with a first reference value. The gain controller 280 receives the amplified voltage signal Va and compares a predetermined first reference value with a voltage level of the amplified voltage signal Va. The first reference value may be defined as the upper limit of a voltage level of the amplified voltage signal Va for changing an analog amplification gain and a digital amplification gain. If the voltage level of the amplified voltage signal Va is not greater than the first reference value, operation S110 is performed. That is, the gain controller 280 may determine that a low sound pressure signal is received, and maintain the output of the second gain control signal. If the voltage level of the amplified voltage signal Va is greater than the first reference value, operation S140 is performed. That is, the gain controller 280 determines that a high sound pressure signal is received.

In operation S140, the microphone driving device 220 outputs a first gain control signal. In operation S140, the transducer 210 senses a high sound pressure signal, and the microphone driving device 220 receives an acoustic signal Vi of a high level. The gain controller 280 generates a first gain control signal and provides the first gain control signal to the first to third adjustment voltage-to-current converters 2412 to 2414 and the digital amplification unit 260.

In operation S150, the microphone driving device 220 blocks the generation of an adjustment output current signal. The first to third adjustment voltage-to-current converters 2412 to 2414 receive a first gain control signal. The first to third adjustment voltage-to-current converters 2412 to 2414 do not generate an adjustment output current signal based on the first gain control signal. Thus, the amplification gain of the analog amplification unit 240 decreases.

In operation S160, the microphone driving device 220 compares the amplified voltage signal Va with a second reference value. The gain controller 280 receives the amplified voltage signal Va and compares a predetermined second reference value with a voltage level of the amplified voltage signal Va. The second reference value may be defined as the lower limit of a voltage level of the amplified voltage signal Va for changing an analog amplification gain and a digital amplification gain. If the voltage level of the amplified voltage signal Va is not less than the second reference value, operation S140 is performed. That is, the gain controller 280 may determine that a high sound pressure signal is received, and maintain the output of the first gain control signal. If the voltage level of the amplified voltage signal Va is less than the second reference value, operation S170 is performed. That is, the gain controller 280 determines that a low sound pressure signal is received.

In operation S170, the microphone driving device 220 outputs a second gain control signal. Operation S170 corresponds to operation S110. That is, after operation S170, operation S120 may be performed. The gain controller 280 generates a second gain control signal and the first to third adjustment voltage-to-current converters 2412 to 2414 provide an adjustment output current signal to the current-to-voltage converter based on the second gain control signal. Thus, the amplification gain of the analog amplification unit 240 increases.

Figure 5:
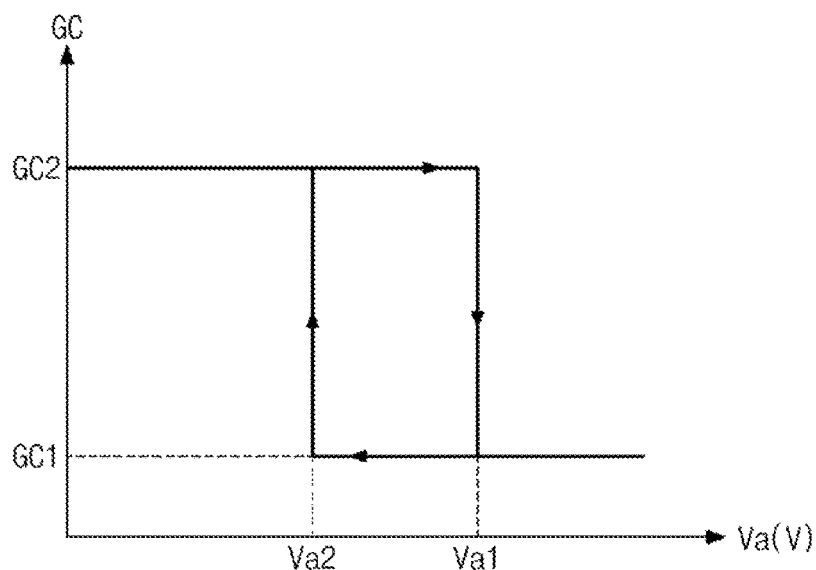
FIG. 5 is a graph illustrating an output of a gain control signal according to an amplified voltage signal.

FIG. 5 is a graph illustrating an output of a gain control signal according to an amplified voltage signal. Referring to FIG. 5, the horizontal axis is defined as a voltage level of the amplified voltage signal Va applied to the gain controller 280 of FIG. 3. The vertical axis is defined as the magnitude of a gain control signal GC outputted by the gain controller 280 of FIG. 3.

A voltage level of the amplified voltage signal Va depends on the sound pressure sensed by the transducer 210. Generally, as the sound pressure sensed by the transducer 210 is greater, the voltage level of the amplified voltage signal Va increases. If the amplified voltage signal Va has a voltage level between 0 and the first reference value Va1, the gain controller 280 outputs a second gain control signal GC2. The second gain control signal GC2 controls the analog amplification gain to be high and the digital amplification gain to be low. The second gain control signal GC2 controls the first to third adjustment voltage-to-current converters 2411 to 2414 of FIG. 3 to generate an adjustment output current signal.

If the amplified voltage signal Va has a voltage level greater than the first reference value Va1, the gain controller 280 outputs a first gain control signal GC1. The first reference value Va1 is defined as a value that decreases the analog amplification gain and increases the digital amplification gain. The first reference value Va1 may correspond to the upper limit of the maximum input signal range of the analog-to-digital converter 250. In addition, the first reference value Va1 may be defined as a voltage level lower than the upper limit of the maximum input signal range of the analog-to-digital converter 250 in order to ensure the stability of signal processing. The first gain control signal GC1 controls the analog amplification gain to be low and the digital amplification gain to be high. The first gain control signal GC1 controls the first to third adjustment voltage-to-current converters 2411 to 2414 of FIG. 3 to block the generation of an adjustment output current signal.

If the amplified voltage signal Va has a voltage level between the second reference value Va2 and the first reference value Va1, the gain controller 280 outputs the first gain control signal GC1. The second reference value Va2 is defined as a value that increases the analog amplification gain and decreases the digital amplification gain. The second reference value Va2 may have a voltage level lower than the first reference value Va1. The second reference value Va2 may be determined in consideration of the amplified voltage signal Va corresponding to the low sound pressure and the discrimination of noise. The second reference value Va2 may be a fixed voltage level, but is not limited thereto and may be a variable voltage level. That is, the first reference value Va1 may be a threshold voltage level for determining the high sound pressure. The high sound pressure is determined by comparing the first reference value Va1 with the amplified voltage signal Va generated based on the second gain control signal GC2. The second reference value Va2 may be a threshold voltage level for determining the low sound pressure. The low sound pressure is determined by comparing the second reference value Va2 with the amplified voltage signal Va generated based on the first gain control signal GC1.

If the amplified voltage signal Va has a voltage level less than the second reference value Va2, the gain controller 280 outputs a second gain control signal GC2. The second gain control signal GC2 controls the analog amplification gain to be high and the digital amplification gain to be low. If the amplified voltage signal Va has a voltage level lower than the second reference value Va2, the gain controller 280 may immediately change the first gain control signal GC1 to the second gain control signal GC2, but is not limited thereto. For example, the gain controller 280 may output the second gain control signal GC2 only when the voltage level of the amplified voltage signal Va does not exceed the second reference value Va2 for a specific time. The digital microphone 200 may continuously receive a low sound pressure and a high sound pressure irregularly, and the gain controller 280 may continuously change the gain control signal GC so that power consumption or overload may occur. By defining a voltage level of the second reference value Va2 to be lower than that of the first reference value Va1 and outputting the second gain control signal GC2 based on the exceeding time of the second reference value Va2, the power consumption of the gain control signal GC may be reduced, and an unnecessary change of the gain control signal GC may be prevented.

Although FIG. 5 exemplarily illustrates that the magnitude of the first gain control signal GC1 is less than the magnitude of the second gain control signal GC2, but the inventive concept is not limited thereto. FIG. 5 illustrates that when the first to third adjustment voltage-to-current converters 2412 to 2414 receive a gain control signal of a high level, it provides an adjustment output current signal. However, when a structure of the first to third adjustment voltage-to-current converters 2412 to 2414 receives a gain control signal of a low level, it provides an adjustment output current signal. In this case, the magnitude of the first gain control signal GC1 may be greater than that of the second gain control signal GC2.

Although FIG. 5 illustratively shows that one gain control signal is used to control an analog amplification gain and a digital amplification gain, the inventive concept is not limited thereto. For example, both the analog amplification unit 240 and the digital amplification unit 260 may have an increased amplification gain when receiving a high-level gain control signal. In this case, in a low sound pressure environment, the gain controller 280 provides a high-level gain control signal to the first to third adjustment voltage-to-current converters 2412 to 2414, and provides a low-level gain control signal to the digital amplification unit 260.

Figure 6:
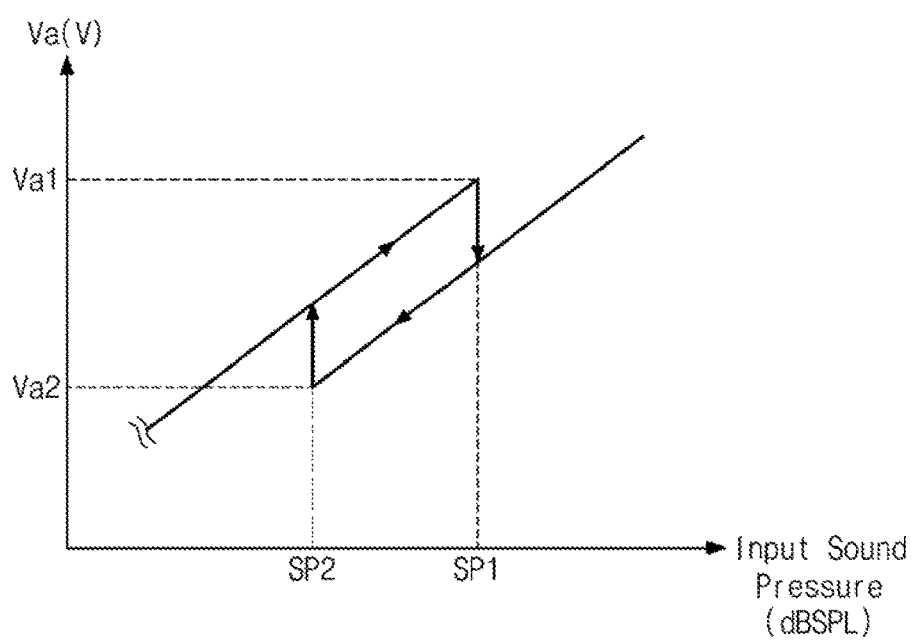
FIG. 6 is a graph illustrating an output of an amplified voltage signal according to an input sound pressure signal.

FIG. 6 is a graph illustrating an output of an amplified voltage signal according to an input sound pressure signal. Referring to FIG. 6, the horizontal axis is defined as the magnitude of the input sound pressure sensed by the transducer 210 of FIG. 3. The input sound pressure sensed by the transducer 210 is defined as an input sound pressure signal. The vertical axis is defined as the voltage level of the amplified voltage signal Va applied to the gain controller 280 of FIG. 3.

When the input sound pressure signal is less than the first input sound pressure SP1, the voltage level of the amplified voltage signal Va increases as the input sound pressure signal increases. When the input sound pressure signal is greater than the first input sound pressure SP1, the gain controller 280 outputs the first gain control signal GC1 such that the voltage level of the amplified voltage signal Va does not exceed the maximum input signal range of the analog-to-digital converter 250. By the first gain control signal GC1, the analog amplification gain decreases and the voltage level of the amplified voltage signal Va decreases. The magnitude of the first input sound pressure SP1 may be preset in consideration of the characteristics of the analog-to-digital converter 250.

When the input sound pressure signal is greater than the second input sound pressure SP2, the voltage level of the amplified voltage signal Va decreases as the input sound pressure signal decreases. When the input sound pressure signal is less than the second input sound pressure SP2, the gain controller 280 outputs a second gain control signal GC2 to prevent the SNR characteristic reduction of the microphone driving device 220. By the second gain control signal GC2, the analog amplification gain increases and the voltage level of the amplified voltage signal Va increases. The magnitude of the second input sound pressure SP2 may be preset in consideration of the SNR characteristics of the microphone driving device 220 or the stability of the gain controller 280.

When a low sound pressure signal less than the second input sound pressure SP2 is sensed, the analog amplification gain is increased and the influence of noise mainly occurring in a low sound pressure environment is reduced. When a high sound pressure signal greater than the first input sound pressure SP1 is sensed, the analog amplification gain is reduced and signal processing of a high sound pressure within the maximum input range by the characteristics of the analog-to-digital converter 250 is possible. That is, the microphone driving device 220 having a higher dynamic range than a case having a fixed analog amplification gain may be provided. Accordingly, the microphone driving device 220 may process a high sound pressure signal of 130 dBSPL or more.

Figure 7:
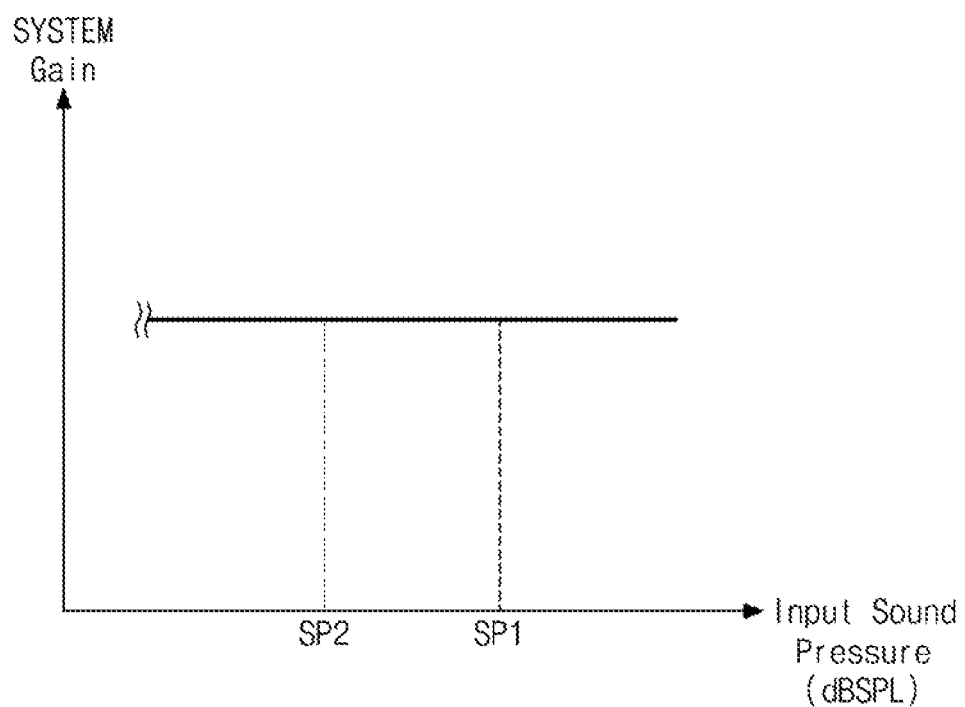
FIG. 7 is a graph illustrating a system amplification gain of a microphone driving device according to an input sound pressure signal.

FIG. 7 is a graph illustrating a system amplification gain of a microphone driving device according to an input sound pressure signal. Referring to FIG. 7, the horizontal axis is defined as the magnitude of the input sound pressure sensed by the transducer 210 of FIG. 3. The vertical axis is defined as the system amplification gain of the microphone driving device 220 of FIG. 3. The system amplification gain is defined as the total amplification gain considering the analog amplification gain by the analog amplification unit 240 and the digital amplification gain by the digital amplification unit 260.

The microphone driving device 220 has a constant system amplification gain regardless of the magnitude of the input sound pressure signal. The microphone driving device 220 amplifies the acoustic signal Vi generated based on the input sound pressure signal to amplified digital signal ADa and provides it to the digital interface 270. That is, the amplification ratio of the amplified digital signal ADa to the acoustic signal Vi remains constant. When the transducer 210 receives an input sound pressure signal having a magnitude of the first input sound pressure SP1, the analog amplification gain decreases and the digital amplification gain increases. The decrease width of the analog amplification gain may be equal to the increase width of the digital amplification gain. When the transducer 210 receives an input sound pressure signal having a magnitude of the second input sound pressure SP2, the analog amplification gain increases and the digital amplification gain decreases. The increase width of the analog amplification gain may be equal to the decrease width of the digital amplification gain. Since the system amplification gain is maintained constant, the digital microphone 200 may secure the quality of digital signal with a wide dynamic range.

Figure 8:
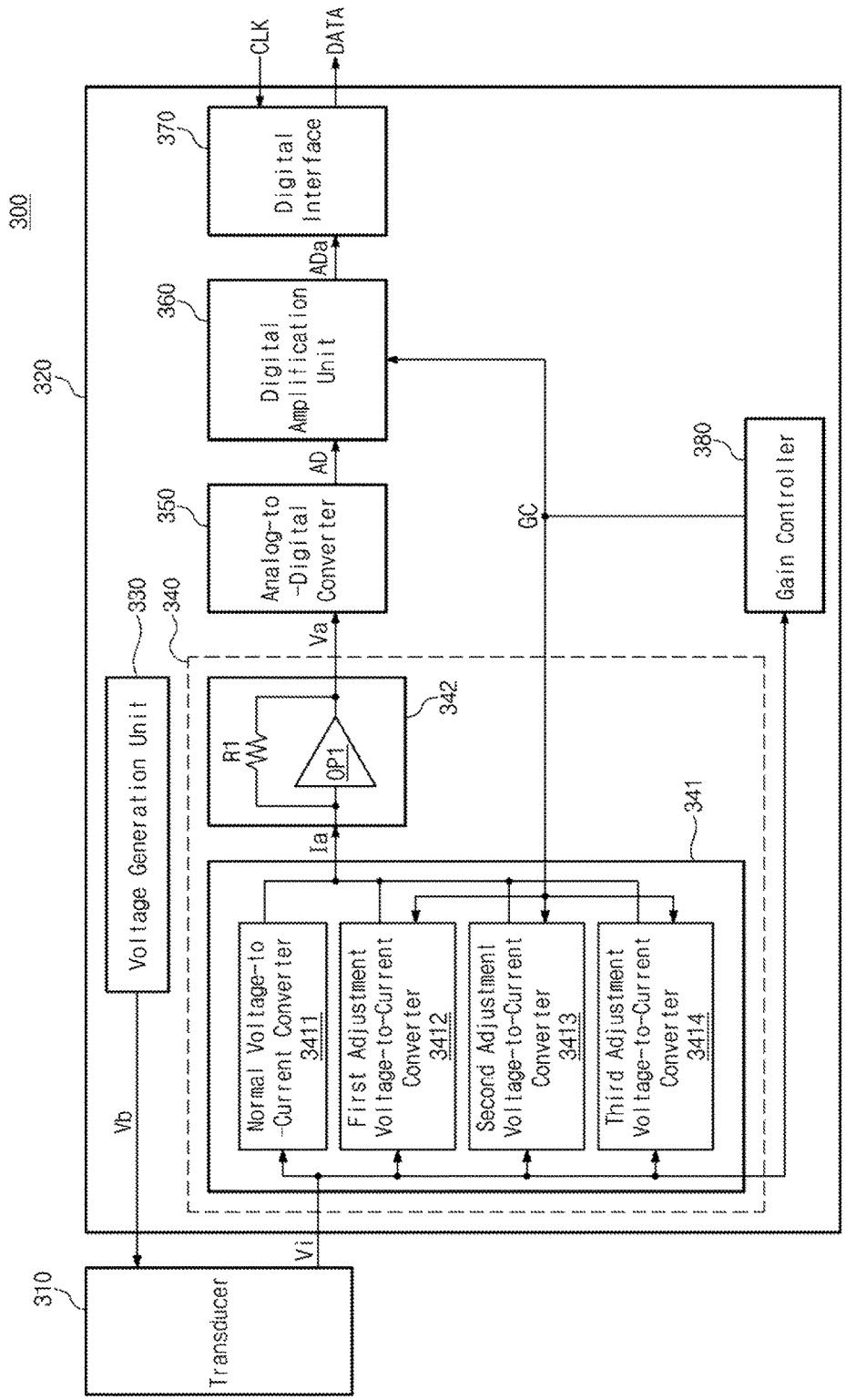
FIGS. 8 and 9 are block diagrams of a digital microphone according to another embodiment of the inventive concept.

FIG. 8 is a block diagram of a digital microphone according to another embodiment of the inventive concept. Referring to FIG. 8, a digital microphone 300 includes a transducer 310 and a microphone driving device 320. The microphone driving device 320 includes a voltage generation unit 330, an analog amplification unit 340, an analog-to-digital converter 350, a digital amplification unit 360, a digital interface 370, and a gain controller 380. The analog amplification unit 340 includes a voltage-to-current converter 341 and a voltage-to-current converter 342. The voltage-to-current converter 341 includes a normal voltage-to-current converter 3411, a first adjustment voltage-to-current converter 3412, a second adjustment voltage-to-current converter 3413, and a third adjustment voltage-to-current converter 3414.

Unlike the digital microphone 200 of FIG. 3, the gain controller 380 of the digital microphone 300 of FIG. 8 receives an acoustic signal Vi. The gain controller 380 may determine the magnitude of the gain control signal GC based on the acoustic signal Vi. The gain controller 380 may receive the acoustic signal Vi not passing through the analog amplification unit 340 from the transducer 310. The gain controller 380 may include an input buffer for receiving the acoustic signal Vi.

When a voltage level of the acoustic signal Vi is high, the gain controller 380 may block the generation of the adjustment output current signals of the first to third adjustment voltage-to-current converters 3412 to 3414. At the same time, the gain controller 380 may increase the amplification gain of the digital amplification unit 360. When a voltage level of the acoustic signal Vi is low, the gain controller 380 may control the first to third adjustment voltage-to-current converters 3412 to 3414 to generate an adjustment output current signal. At the same time, the gain controller 380 may decrease the amplification gain of the digital amplification unit 360.

If the voltage level of the acoustic signal Vi is greater than a first reference value, the gain controller 280 controls to lower an analog amplification gain, and if the voltage level of the acoustic signal Vi is less than the second reference value, controls to increase an analog amplification gain. The magnitudes of the first reference value Va1 of FIG. 3 and the first reference value of FIG. 8 may be different from each other. For example, since the first reference value Va1 of FIG. 3 has a voltage level set considering the analog amplification of the acoustic signal Vi, the first reference value Va1 of FIG. 8 may have a lower voltage level than the first reference value Va1 of FIG. 3. The magnitudes of the second reference value Va2 of FIG. 3 and a second reference value of FIG. 8 may be different from each other. However, the second reference value Va2 in FIG. 3 has a voltage level considering the case that the amplification of the acoustic signal Vi is lowered. If the microphone driving device 220 of FIG. 3 sets the analog amplification gain to 1 in a high sound pressure environment, the voltage levels of the acoustic signal Vi and the amplified voltage signal Va may be the same. In this case, the magnitudes of the second reference value Va2 in FIG. 3 and the second reference value in FIG. 8 may be the same.

Figure 9:
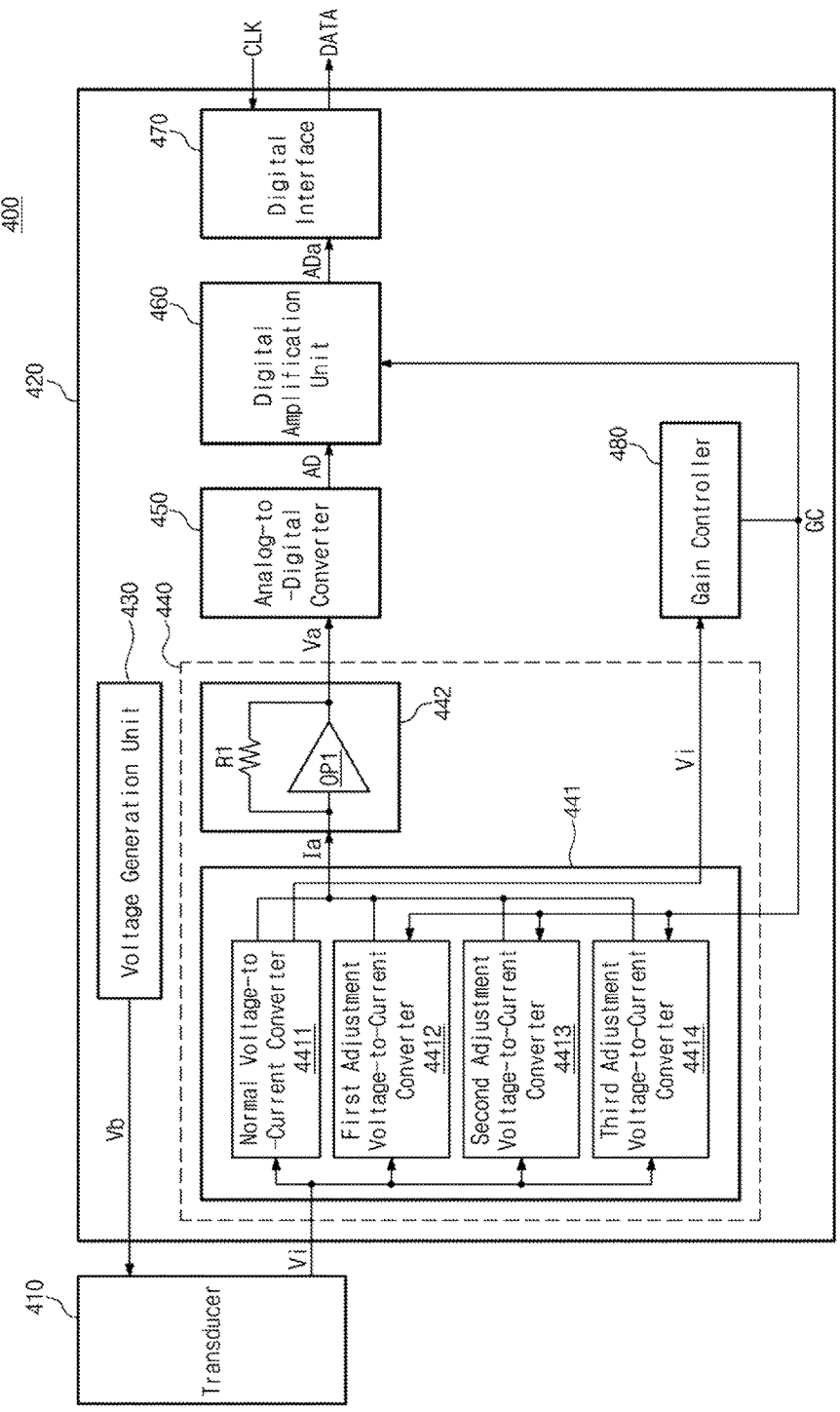

FIG. 9 is a block diagram of a digital microphone according to another embodiment of the inventive concept. Referring to FIG. 9, a digital microphone 400 includes a transducer 410 and a microphone driving device 420. The microphone driving device 420 includes a voltage generation unit 430, an analog amplification unit 440, an analog-to-digital converter 450, a digital amplification unit 460, a digital interface 470, and a gain controller 480. The analog amplification unit 440 includes a voltage-to-current converter 441 and a voltage-to-current converter 442. The voltage-to-current converter 441 includes a normal voltage-to-current converter 4411, a first adjustment voltage-to-current converter 4412, a second adjustment voltage-to-current converter 4413, and a third adjustment voltage-to-current converter 4414.

The gain controller 480 of the digital microphone 400 of FIG. 9 receives an acoustic signal Vi. However, unlike FIG. 8, the gain controller 480 receives the acoustic signal Vi from the normal-voltage-to-current converter 4411. The normal voltage-to-current converter 4411 receives the acoustic signal Vi from the transducer 410 and outputs a normal output current signal and the acoustic signal Vi. The normal voltage-to-current converter 4411 provides the normal output current signal to the current-to-voltage converter 442 and provides the acoustic signal Vi to the gain controller 480. Like FIG. 8, the gain controller 480 of FIG. 9 may determine the magnitude of the gain control signal GC based on the acoustic signal Vi. Since the gain controller 480 receives the acoustic signal Vi from the normal voltage-to-current converter 4411, no separate input terminal is required to provide the acoustic signal Vi to the gain controller 480.

Figure 10:
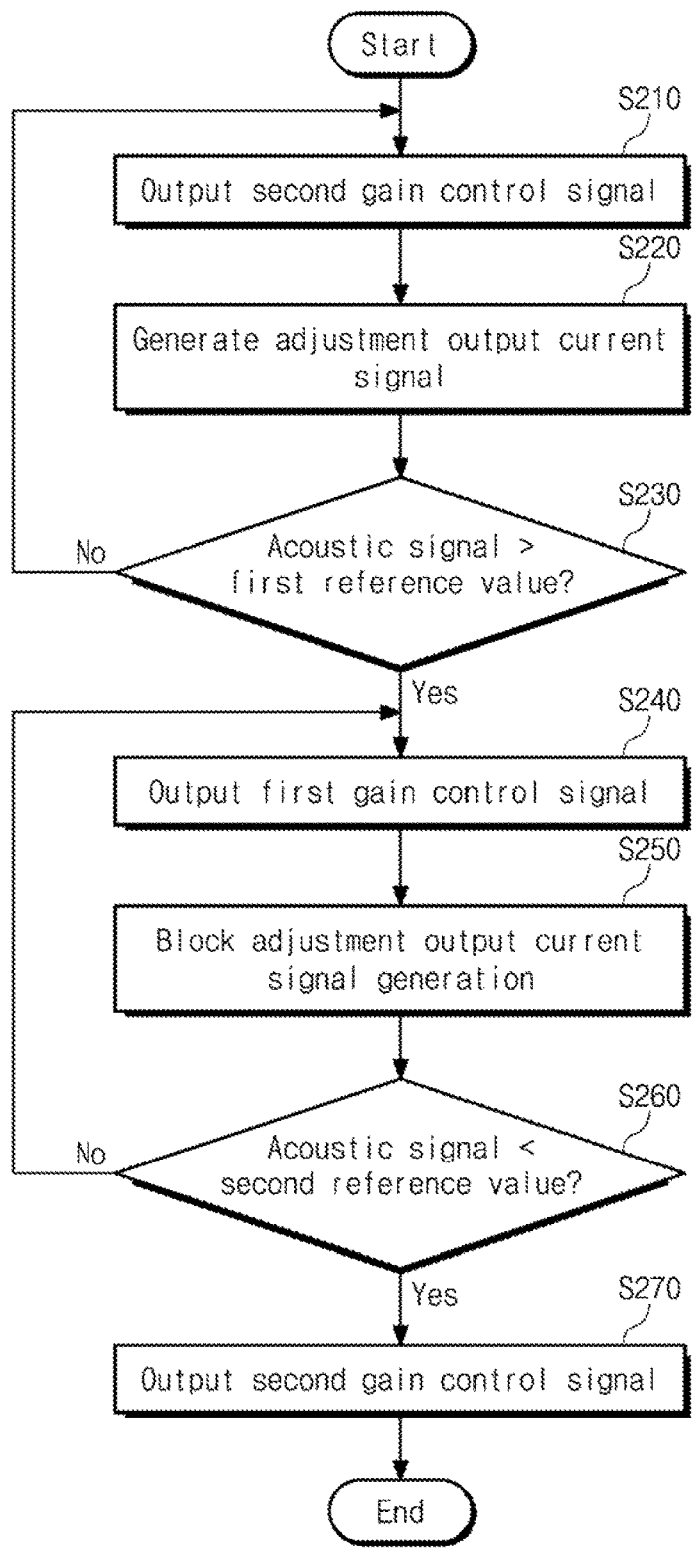
FIG. 10 is a flowchart illustrating a driving method of microphone driving devices of FIGS. 8 and 9.

FIG. 10 is a flowchart illustrating a driving method of the microphone driving devices of FIGS. 8 and 9. The driving method of the microphone driving device of FIG. 10 is performed in the microphone driving device 320 of FIG. 8 or in the microphone driving device 420 of FIG. 9. In the start operation, it will be understood that the digital microphone 300 or 400 senses a low sound pressure. For convenience of description, it is assumed that the driving method of the microphone driving device is performed using the microphone driving device 320 of FIG. 8

In operation S210, the microphone driving device 320 outputs a second gain control signal. The gain controller 380 receives the acoustic signal Vi and generates the second gain control signal. The gain controller 380 generates a second gain control signal and provides the second gain control signal to the first to third adjustment voltage-to-current converters 3412 to 3414 and the digital amplification unit 360. In operation S220, each of the first to third adjustment voltage-to-current converters 3412 to 3414 generates an adjustment output current signal. The first to third adjustment voltage-to-current converters 3412 to 3414 provide the adjustment output current signal to the current-to-voltage converter 342. Thus, the amplification gain of the analog amplification unit 340 increases.

In operation S230, the microphone driving device 320 compares the acoustic signal Vi with a first reference value. As described above, the first reference value may have a different voltage level than the first reference value of FIG. 4. If the voltage level of the acoustic signal Vi is not greater than the first reference value, operation S210 is performed and the gain controller 380 maintains the output of the second gain control signal. If the voltage level of the acoustic signal Vi is greater than the first reference value, operation S240 is performed.

In operation S240, the microphone driving device 320 outputs a first gain control signal. The gain controller 380 receives the acoustic signal Vi and generates the first gain control signal. In operation S250, the gain controller 380 blocks the generation of an adjustment output current signal. Thus, the amplification gain of the analog amplification unit 340 decreases.

In operation S260, the microphone driving device 320 compares the acoustic signal Vi with a second reference value. The second reference value may have a less voltage level than the first reference value. If the voltage level of the acoustic signal Vi is not less than the first reference value, operation S240 is performed. If the voltage level of the acoustic signal Vi is less than the first reference value, operation S270 is performed. In operation S270, the microphone driving device 320 outputs a second gain control signal. Operation S270 corresponds to operation S210. That is, after operation S270, operation S220 may be performed.

Figure 11:
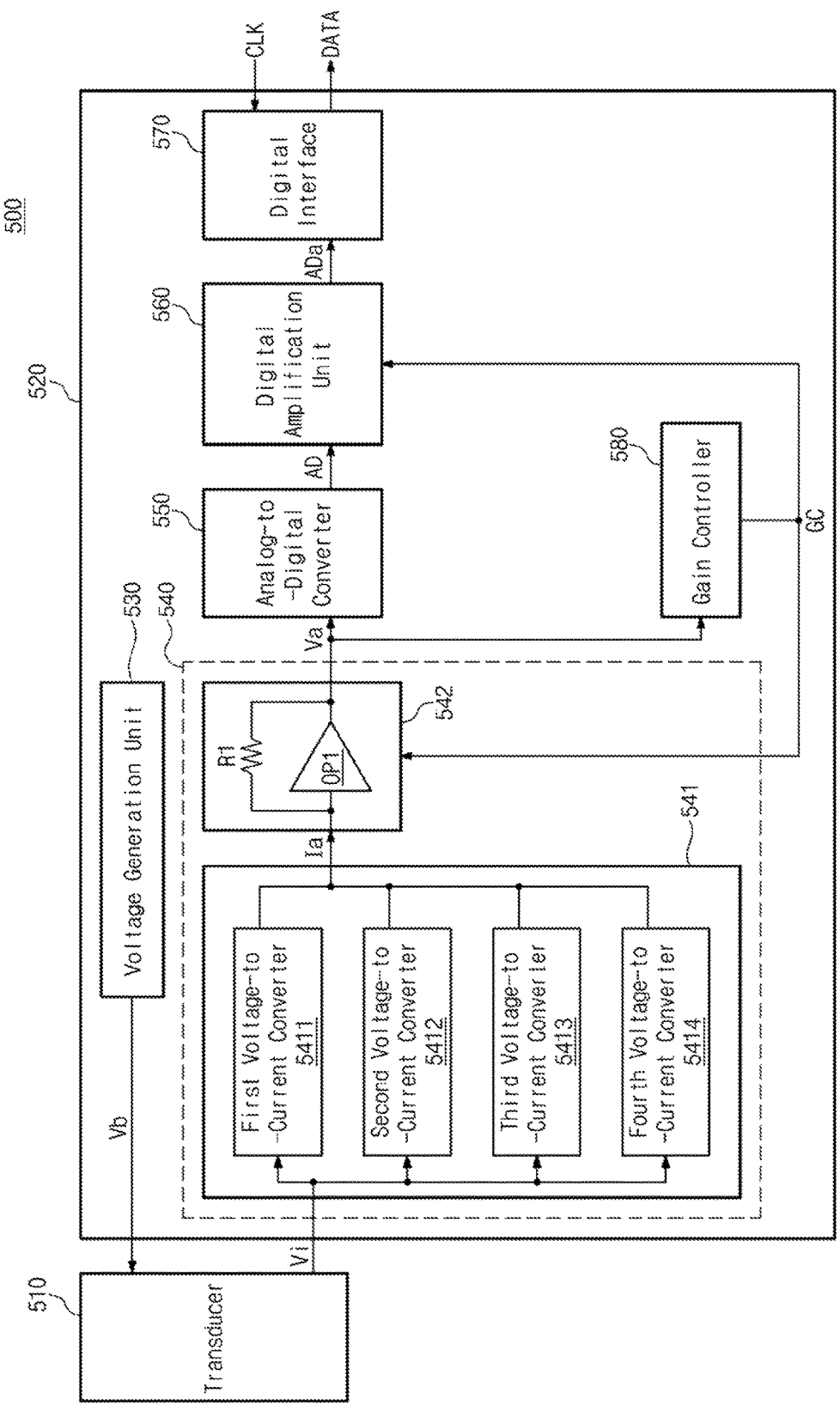
FIG. 11 is a block diagram of a digital microphone according to another embodiment of the inventive concept.

FIG. 11 is a block diagram of a digital microphone according to another embodiment of the inventive concept. Referring to FIG. 11, a digital microphone 500 includes a transducer 510 and a microphone driving device 520. The microphone driving device 520 includes a voltage generation unit 530, an analog amplification unit 540, an analog-to-digital converter 550, a digital amplification unit 560, a digital interface 570, and a gain controller 580. The analog amplification unit 540 includes a voltage-to-current converter 541 and a voltage-to-current converter 542.

The voltage-to-current converter 541 includes first to fourth voltage-to-current converters 5411 to 5414. Unlike the voltage-to-current converter 241 of FIG. 3, the voltage-to-current converter 341 of FIG. 8, and the voltage-to-current converter 441 of FIG. 9, the voltage-to-current converter 541 does not receive the gain control signal GC. Accordingly, the first to fourth voltage-to-current converters 5411 to 5414 convert the acoustic signal Vi to the output current signal Ia regardless of the gain control signal GC.

The current-to-voltage converter 542 converts the output current signal Ia to an amplified voltage signal Va. The current-to-voltage converter 542 receives the gain control signal GC. The current-to-voltage converter 542 generates an amplified voltage signal Va based on the gain control signal GC. The current-to-voltage converter 542 may include an operational amplifier OP2 and a resistor R1. For example, the operational amplifier OP2 may receive the gain control signal GC and determine the voltage level of the amplified voltage signal Va based on the gain control signal GC. The current-to-voltage converter 542 determines an amplification gain based on the gain control signal GC. The gain control signal GC controls the current-to-voltage converter 542 so that an analog amplification gain when a low sound pressure is sensed is greater than an analog amplification gain when a high sound pressure is sensed.

The gain controller 580 receives an amplified voltage signal Va. The gain controller 580 generates a gain control signal GC based on the amplified voltage signal Va. However, the inventive concept is not limited thereto, and the gain controller 580 may receive the acoustic signal Vi and generate the gain control signal GC based on the acoustic signal Vi. The gain controller 580 provides the gain control signal GC to the current-to-voltage converter 542 and the digital amplification unit 560.

The gain controller 580 generates a first gain control signal when the amplified voltage signal Va has a higher voltage level than the first reference value. The current-to-voltage converter 542 receives the first gain control signal and lowers the voltage level of the amplified voltage signal Va. That is, the analog amplification gain decreases. Simultaneously, the digital amplification unit 560 increases the digital amplification gain based on the first gain control signal. The gain controller 580 generates a second gain control signal when the amplified voltage signal Va has a lower voltage level than the second reference value. The current-to-voltage converter 542 receives the second gain control signal and increases the voltage level of the amplified voltage signal Va. That is, the analog amplification gain increases. Simultaneously, the digital amplification unit 560 decreases the digital amplification gain based on the second gain control signal.

A microphone driving device and a digital microphone including the same according to an embodiment of the inventive concept may expand a dynamic range through an active amplification gain control using current output type signal amplification and improve the SNR performance.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:
1. A microphone driving device comprising:
an analog amplification unit configured to amplify an acoustic signal to an amplified voltage signal based on a first gain control signal or a second gain control signal;
an analog-to-digital converter configured to convert the amplified voltage signal to a digital signal;
an amplifier configured to amplify the digital signal to an amplified digital signal based on the first gain control signal or the second gain control signal; and
a gain controller configured to generate the first gain control signal when a magnitude of the acoustic signal is in a first range and the second gain control signal when the magnitude of the acoustic signal is in a second range less than the first range,
wherein the analog amplification unit comprises:
a voltage-to-current converter configured to convert the acoustic signal to an output current signal; and
a current-to-voltage converter configured to convert the output current signal to the amplified voltage signal,
wherein when the analog amplification unit and the amplifier receive the first gain control signal, the analog amplification unit amplifies the acoustic signal based on a first analog amplification gain and the amplifier amplifies the digital signal based on a first digital amplification gain,
wherein when the analog amplification unit and the amplifier receive the second gain control signal, the analog amplification unit amplifies the acoustic signal based on a second analog amplification gain and the amplifier amplifies the digital signal based on a second digital amplification gain, and
wherein the first analog amplification gain is lower than the second analog amplification and the first digital amplification gain is higher than the second digital amplification.

2. The device of claim 1, wherein the voltage-to-current converter comprises:
a normal voltage-to-current converter configured to convert the acoustic signal to a normal output current signal; and
an adjustment voltage-to-current converter connected in parallel to the normal voltage-to-current converter and configured to convert the acoustic signal to an adjustment output current signal.

3. The device of claim 2, wherein the adjustment voltage-to-current converter comprises:
a first adjustment voltage-to-current converter configured to convert the acoustic signal to a first adjustment output current signal; and
a second adjustment voltage-to-current converter connected in parallel to the first adjustment voltage-to-current converter and configured to convert the acoustic signal to a second adjustment output current signal.

4. The device of claim 2, wherein the adjustment voltage-to-current converter generates the adjustment output current signal based on the second gain control signal.

5. The device of claim 2, wherein the adjustment voltage-to-current converter blocks the generation of the adjustment output current signal based on the first gain control signal.

6. The device of claim 2, wherein the voltage-to-current converter receives the second gain control signal to provide the output current signal obtained by adding the normal output current signal and the adjustment output current signal to the current-to-voltage converter.

7. The device of claim 2, wherein the gain controller generates the first gain control signal or second gain control signal based on the amplified voltage signal, and provides the gain control signal to the adjustment voltage-to-current converter and the digital amplification unit.

8. The device of claim 2, wherein the gain controller generates the first gain control signal or the second gain control signal based on the acoustic signal, and provides the gain control signal to the adjustment voltage-to-current converter and the amplifier.

9. The device of claim 8, wherein the normal voltage-to-current converter provides the acoustic signal to the gain controller.

10. The device of claim 1, wherein the gain controller generates the first gain control signal when the amplified voltage signal is greater than a first reference value and generates the second gain control signal when the amplified voltage signal is less than a second reference value less than the first reference value.

11. The device of claim 10, wherein the gain controller generates the first gain control signal when the amplified voltage signal greater than the first reference value becomes less than the first reference value and generates the second gain control signal when the amplified voltage signal becomes less than the second reference value.

12. The device of claim 10, wherein the gain controller generates the second gain control signal when the amplified voltage signal less than the second reference value becomes greater than the second reference value and generates the first gain control signal when the amplified voltage signal becomes greater than the first reference value.

13. The device of claim 1, wherein an amplification gain of the amplified digital signal for the acoustic signal when the digital amplification unit receives the first gain control signal is equal to an amplification gain of the amplified digital signal for the acoustic signal when the amplifier receives the second gain control signal.

14. The device of claim 1, wherein the voltage-to-current converter comprises:
a first voltage-to-current converter configured to convert the acoustic signal to a first output current signal; and
a second voltage-to-current converter connected in parallel to the first voltage-to-current converter and configured to convert the acoustic signal to a second output current signal.

15. The device of claim 14, wherein the current-to-voltage converter receives the first output current signal and second output current signal and generates the amplified voltage signal based on the first gain control signal or the second gain control signal.

16. A digital microphone comprising:
a transducer configured to sense an input sound pressure and generate an acoustic signal based on the input sound pressure;
a normal voltage-to-current converter configured to convert the acoustic signal to a normal output current signal;
a plurality of adjustment voltage-to-current converters configured to convert the acoustic signal to an adjustment output current signal based on a gain control signal and connected in parallel to the normal voltage-to-current converter;
a current-to-voltage converter configured convert the normal output current signal and the adjustment output current signal to an amplified voltage signal;
an analog-to-digital converter configured to convert the amplified voltage signal to a digital signal;
an amplifier configured to amplify the digital signal based on the gain control signal; and
a gain controller configured to generate the gain control signal based on the input sound pressure,
wherein the gain control signal comprises:
a first gain control signal generated when the input sound pressure is in a first range; and
a second gain control signal generated when the input sound pressure is in a second range less than the first range,
wherein when the plurality of adjustment voltage-to-current converters receive the second gain control signal, the plurality of adjustment voltage-to-current converters output the adjustment output current signal
wherein when the amplifier receives the first gain control signal, the amplifier amplifies the digital signal based on a first digital amplification gain, and
wherein when the amplifier receives the second gain control signal, the amplifier amplifies the digital signal based on a second digital amplification gain lower than the first digital amplification gain.

17. The digital microphone of claim 16, wherein the gain controller receives the amplified voltage signal and determines whether to generate the adjustment output current signal according to a voltage level of the amplified voltage signal.

18. The digital microphone of claim 16, wherein the gain controller receives the acoustic signal and determines whether to generate the adjustment output current signal according to a voltage level of the acoustic signal.

19. A microphone driving device comprising:
an analog amplification unit configured to amplify an acoustic signal to an amplified voltage signal based on a gain control signal;
an analog-to-digital converter configured to convert the amplified voltage signal to a digital signal;
an amplifier configured to amplify the digital signal to an amplified digital signal based on the gain control signal; and
a gain controller configured to generate the gain control signal,
wherein the analog amplification unit comprises:
a voltage-to-current converter configured to convert the acoustic signal to an output current signal; and
a current-to-voltage converter configured to convert the output current signal to the amplified voltage signal,
wherein the gain controller generates the gain control signal based on the amplified voltage signal, and provides the gain control signal to an adjustment voltage-to-current converter included in the voltage-to-current converter and the amplifier,
wherein the gain controller generates a first gain control signal when the amplified voltage signal is greater than a first reference value and generates a second gain control signal when the amplified voltage signal is less than a second reference value less than the first reference value, and
wherein the gain controller generates the first gain control signal when the amplified voltage signal greater than the first reference value becomes less than the first reference value and generates the second gain control signal when the amplified voltage signal becomes less than the second reference value.

* * * * *